US005592420A

United States Patent [19]
Cernea et al.

[11] Patent Number: 5,592,420
[45] Date of Patent: Jan. 7, 1997

[54] PROGRAMMABLE POWER GENERATION CIRCUIT FOR FLASH EEPROM MEMORY SYSTEMS

[75] Inventors: Raul-Adrian Cernea, Cupertino; Douglas J. Lee, San Jose; Mehrdad Mofidi, Fremont; Sanjay Mehrotra, Milpitas, all of Calif.

[73] Assignee: SanDisk Corporation, Sunnyvale, Calif.

[21] Appl. No.: 482,939

[22] Filed: Jun. 7, 1995

Related U.S. Application Data

[62] Division of Ser. No. 325,774, Oct. 17, 1994, Pat. No. 5,508,971.

[51] Int. Cl.$^6$ .................................................. G11C 11/34
[52] U.S. Cl. ........................... 365/185.18; 365/185.33; 365/189.09; 365/226
[58] Field of Search ........................ 365/185.33, 185.18, 365/189.09, 226, 189.12

[56] References Cited

U.S. PATENT DOCUMENTS

| | | |
|---|---|---|
| 4,970,692 | 11/1990 | Ali et al. |
| 5,267,218 | 11/1993 | Elbert . |
| 5,418,752 | 5/1995 | Harari et al. . |
| 5,426,391 | 6/1995 | Tedrow et al. . |
| 5,430,859 | 7/1995 | Norman et al. . |
| 5,440,520 | 8/1995 | Schutz et al. ............................ 365/226 |
| 5,444,664 | 8/1995 | Kuroda et al. ............................ 365/226 |

*Primary Examiner*—David C. Nelms
*Assistant Examiner*—Huan Hoang
*Attorney, Agent, or Firm*—Majestic, Parsons, Siebert & Hsue

[57] ABSTRACT

An flash EEPROM system functioning as a mass storage medium for a host computer includes a controller and at least one flash EEPROM memory module. The flash EEPROM memory module includes at least one flash EEPROM chip having an on-chip programmable power generation circuit including a high voltage generator circuit capable of generating a high voltage Vpp from a logic level voltage Vdd provided to the chip, a serial protocol logic circuit, a data latch, a data bus, a register address decoder, and a multi-voltage generator/regulator. The multi-voltage generator/regulator includes a plurality of registers and provides the programming, reading, and erasing voltages required for proper operation of the flash EEPROM system from digital values stored in the plurality of registers by the controller. The high voltage generator circuit includes both high current and low current charge pump circuits for generating the high voltage Vpp. The high current charge pump circuit is connected to relatively large off-chip charge storage devices, and the low current charge pump circuit is connected to relatively small on-chip charge storage devices. The controller may activate one or the other of the high or low current charge pump circuits through control signals connected to enabling circuitry respectively connected to the high and low current charge pump circuits. Alternatively, the controller may deactivate both the high and low current charge pump circuits and cause the high voltage Vpp to be provided from other circuitry on another flash EEPROM chip in the flash EEPROM module.

13 Claims, 13 Drawing Sheets

|    | PROGRAM | READ | ERASE |
|----|---------|------|-------|
| WL | 11      | 5    | 0     |
| BL | 8       | 1    | 0     |
| EG | 2       | 2    | 20    |

PROGRAMMABLE POWER GENERATION CIRCUIT FOR FLASH EEPROM MEMORY SYSTEMS

This is a division of application Ser. No. 08/325,774, filed Oct. 17, 1994, now U.S. Pat. No. 5,508,971.

BACKGROUND OF THE INVENTION

This invention relates in general to power generation circuits for integrated circuits ("ICs") and in particular, to power generation circuits for ICs having flash electrically erasable and programmable read-only-memory ("flash EEPROM") cells.

ICs having flash EEPROM cells require a high voltage Vpp for programming and erasing the flash EEPROM cells in addition to a standard logic level voltage Vdd for reading the flash EEPROM cells. Accordingly, conventional systems employing such ICs (hereinafter referred to as "flash EEPROM chips") include in addition to a power supply providing the standard logic level voltage Vdd (e.g., 5.0 volts), either a second power supply providing the high voltage Vpp (e.g., 12.0 volts), or a DC—DC converter generating the high voltage Vpp from the standard logic level voltage Vdd.

FIGS. 1A–1B illustrate one example of a system employing flash EEPROM chips. In FIG. 1A, a flash EEPROM system 20 is illustrated wherein the flash EEPROM system 20 serves as a mass storage medium for a host computer 10 by emulating a hard disk system. The host computer 10 interfaces with the flash EEPROM system 20 by communicating conventional hard disk drive read and write commands through system bus 15 to a controller 40 in the flash EEPROM system 20. The controller 40 interprets the disk drive commands from the host computer 10, and translates them into corresponding read and write operations for a flash EEPROM module 30 in the flash EEPROM system 20, in a manner transparent to the host computer 10. Additional details of the operation of such a flash EEPROM system are described, for example, in U.S. patent application Ser. No. 07/736,733, filed Jul. 26, 1991, entitled "Solid-State Memory System Including Plural Memory Module Mounts and Serial Connections," and naming Robert D. Norman, Karl M. J. Lofgren, Jeffrey D. Stai, Anil Gupta, and Sanjay Mehrotra as inventors, which is incorporated herein by this reference.

In FIG. 1B, the flash EEPROM module 30 is further detailed as containing a plurality of flash EEPROM chips, 31-1 to 31-n, wherein each flash EEPROM chip, e.g., 31-1, is further detailed as including a plurality of flash EEPROM cells 33 and memory circuitry 34 for accessing selected ones of the flash EEPROM cells 33. Although not shown, the flash EEPROM cells 33 can be further organized in a matrix array and selectively accessed through a plurality of word lines connected to their respective control gates and a plurality of bit lines connected to their respective drains such as, for example, the flash EEPROM cell 33-1 of FIG. 3A.

In systems where the host computer 10 only provides a logic level voltage Vdd to the flash EEPROM system 20, such as, for example, in a personal computer system, the high voltage Vpp required for programming and erasing the flash EEPROM cells in the flash EEPROM system 20 is generated within the flash EEPROM system 20 itself. Such generation of the high voltage Vpp may be accomplished, for example, by including in the flash EEPROM system 20 a charge pump circuit or DC—DC converter device which generates the high voltage Vpp from the logic level voltage Vdd provided by the host computer 10.

FIGS. 2A–2C illustrate, as examples, three configurations for such an flash EEPROM system 20. In each of the configurations, at least one DC—DC converter is included within the flash EEPROM system 20 for generating the high voltage Vpp from the logic level voltage Vdd provided by the host computer 10. In FIG. 2A, the DC—DC converter device 46 is included in the controller 40; in FIG. 2B, the DC—DC converter device 46' is included in the flash EEPROM module 30; and in FIG. 2C, DC—DC converter devices 46-1" to 46-n" are each respectively included in a corresponding one of the flash EEPROM chips 31-1 to 31-n of the flash EEPROM module 30.

In flash EEPROM systems where the controller 40 and the flash EEPROM module 30 are combined on a single printed circuit board, such as, for example, in a memory card adapted to be inserted into a slot provided in a personal computer, FIGS. 2A and 2B are substantially equivalent configurations. Such a configuration is described, for example, in U.S. Pat. No. 5,267,218 entitled "Non-volatile Memory Card with a Single Power Supply Input," and issued to Elbert, which is incorporated herein by this reference.

One problem with such a configuration as described in U.S. Pat. No. 5,267,218 is that the DC—DC converter device 46 is typically a separate component such as an LT1109-12 DC—DC converter manufactured by Linear Technology Corp. of Milpitas, Calif. As a consequence, the cost of this separate component must be added to the component costs of the processor 43 and flash EEPROM chips 31-1 to 31-n, thus increasing the component cost for the flash EEPROM system. Also, additional board space is required on the printed circuit board to accommodate such a separate component, thus increasing the board cost for the flash EEPROM system. Further, failure of this separate component results in failure of the entire flash EEPROM system, thus reducing the reliability of the flash EEPROM system. Such a problem is similarly experienced in configurations where the controller 40 and the flash EEPROM module 30 are on separate printed circuit boards.

In FIG. 2C, each of the flash EEPROM chips 31-1 to 31-n includes a respective one of the DC—DC converters 46-1" to 46-n". By including a DC—DC converter on each of the flash EEPROM chips 31-1 to 31-n, the additional component cost of a separate DC—DC converter component is avoided, the additional board space required for the separate DC—DC converter component is avoided, and the reliability of the flash EEPROM system is enhanced through such redundancy. However, a major problem with including a DC—DC converter on each of the flash EEPROM chips 31-1 to 31-n is that this approach increases the die size of the flash EEPROM chips and as a result, the costs of the flash EEPROM chips increases accordingly. In particular, where each of the DC—DC converters 46-1" to 46-n" is formed of a charge pump including a plurality of charge storage devices such as capacitors, the die area required for the charge storage devices may be considerable relative to that required for the flash EEPROM cells and memory circuitry on the flash EEPROM chip.

In certain flash EEPROM systems, a number of voltages V1 to Vk in lieu of or besides the high voltage Vpp may be required for properly operating the flash EEPROM cells of the flash EEPROM chips 31-1 to 31-n. Generally, these voltages V1 to Vk may be generated from the high voltage Vpp and/or logic level voltage Vdd by either on-chip circuitry such as circuits 32-1 to 32-n and 32-1' to 32-n' (FIGS. 2A–2C) respectively residing on flash EEPROM chips 31-1 to 31-n and 31-1' to 31-n', or by off-chip circuitry (not shown) residing, for example, on a printed circuit board of the flash EEPROM module 30, 30' or 30" (FIGS. 2A–2C, respectively). Additional details of certain flash EEPROM cells and their operational characteristics for one such flash EEPROM system are described, for example, in U.S. Pat. No. 5,198,380 entitled "Method of Highly Compact EPROM and Flash EEPROM Devices," and issued to Harari, which is incorporated herein by this reference.

In particular, FIGS. 3A and 3B illustrate one example of such voltages V1 to Vk required to operate one flash EEPROM cell 33-1 (e.g., FIG. 3A) of a plurality of flash EEPROM cells 33. To selectively program the flash EEPROM cell 33-1, its source "S" may be connected to ground "GND" (e.g., 0 volts), its drain "D" connected through bit line "BL" to 8.0 volts, its control gate "CG" connected through word line "WL" to 11.0 volts, and its erase gate "EG" connected to 2.0 volts. To read the flash EEPROM cell 33-1, its source "S" may be connected to ground "GND", its drain "D" connected through bit line "BL" to 1.0 volts, its control gate "CG" connected through word line "WL" to 5.0 volts, and its erase gate "EG" connected to 2.0 volts. To erase the flash EEPROM cell 33-1, its source "S", drain "D" and control "CG" gates may be connected to ground "GND", and its erase gate "EG" connected to 20.0 volts. Thus, in this simple example, to program, read, and erase the flash EEPROM cell 33-1, voltages of 20.0, 11.0, 8.0, 5.0, 2.0, 1.0 and ground (e.g., 0 volts) are required. In a more complicated example, additional voltages may also be required to verify the programming or erasing of the flash EEPROM cell 33-1.

Although described as fixed values in the above example, in practice, the optimal values for such operating voltages V1 to Vk may vary between different flash EEPROM chips initially (i.e., for flash EEPROM chips which have never been programmed and/or erased before), as well as for a given flash EEPROM chip over its operational life (i.e., for an flash EEPROM chip having increasing numbers of programming and erasing cycles). One reason for the optimal values of such programming, reading, and erasing voltages V1 to Vk to be different initially is that the optimal values for such voltages V1 to Vk are at least partially determined by the flash EEPROM chip's manufacturing process. Thus, flash EEPROM chips originating from different flash EEPROM manufacturers may have different optimal values and as a consequence, flash EEPROM systems employing flash EEPROM chips from different flash EEPROM manufacturers may have flash EEPROM chips having different optimal values initially. Although, this problem may be solved by including only flash EEPROM chips from one manufacturer in a flash EEPROM system, such a solution may often times be commercially impractical.

One reason for such optimal values to vary for a given flash EEPROM chip over the operational life of the flash EEPROM chip is that the optimal values for such voltages V1 to Vk for each flash EEPROM cell of the flash EEPROM chip are at least partially determined by the number of times that that flash EEPROM cell has been programmed and erased over its operational life. For example, as charge accumulates in an isolation region between a floating gate and erase gate of a flash EEPROM cell through repeated programming and erasures of the cell, it becomes increasingly difficult to erase the cell and consequently, higher and higher erase voltages may need to be applied to the erase gate to completely erase the cell within a reasonable period of time.

Conventional power generation circuits, such as those depicted in FIGS. 2A–2C, for flash EEPROM chips, however, are not adapted to providing such optimal programming, reading, and erasing voltages over the lifetime of their respective flash EEPROM chips. Generally, the voltages that they provide are fixed at the time of manufacture. Consequently, the voltages are set at a fixed level which may exceed the optimal programming, reading, and erasing voltages for each flash EEPROM cell early in the cell's lifetime, thus overstressing and reducing the life of the cell, and may fall short of the optimal programming, reading, and erasing voltages for each cell as the cell matures, thus resulting in increasing numbers of programming and erasure failures.

OBJECTS AND SUMMARY OF THE INVENTION

Accordingly, it is an object of the present invention to provide a power generation circuit to be included in a flash EEPROM system without the previously described drawbacks of the prior art. In particular, it is an object of the present invention to provide a technique and apparatus capable of providing optimal programming, reading, and erasing voltages to a flash EEPROM chip over the lifetime of the flash EEPROM chip.

These and other objects are accomplished through the various aspects of the present invention, wherein briefly stated, one aspect is a flash EEPROM system comprising at least one flash EEPROM chip, a controller for controlling operations of the chip, and a programmable power source for supplying operating power to the chip, wherein the programmable power source is programmed by the controller in response to predefined parameters of the flash EEPROM system.

In another aspect, a programmable voltage generator circuit for a flash EEPROM chip comprises means for generating a high voltage and current from a low voltage source, a plurality of registers for storing information indicative of a plurality of voltages for programming, reading, and erasing the flash EEPROM chip, and a plurality of digital-to-analog converters for converting the digital information stored in the plurality of registers into a corresponding plurality of analog voltage signals respectively related to the plurality of voltages for programming, reading, and erasing the flash EEPROM chip.

In still another aspect, an on-chip method of generating a plurality of voltages suitable for programming, reading, and erasing a plurality of flash EEPROM cells comprises the steps of: respectively storing information indicative of the plurality of voltages in a plurality of registers; respectively converting the information stored in the plurality of registers into a plurality of analog signals; and respectively generating the plurality of voltages by amplifying and regulating the plurality of analog signals.

In still another aspect, a charge pump circuit for generating a high voltage and current suitable for programming a flash EEPROM chip, comprises charge storage means connected to the flash EEPROM chip, and a plurality of transistors formed on the flash EEPROM chip and connected to the external charge storage means such that the plurality of transistors generate from an input voltage, an output voltage and current sufficient to program the flash EEPROM chip.

In still another aspect, a flash EEPROM system comprises a controller, and a flash EEPROM module having at least one surface whereupon a plurality of flash EEPROM chips and a charge storage means are mounted, wherein each of the flash EEPROM chips includes a plurality of transistors connected to the charge storage means such that the plurality of transistors in a selected one of the flash EEPROM chips generates from an input voltage, an output voltage and current sufficient to program its respective flash EEPROM chip, or selectably another one of the plurality of flash EEPROM chips.

In still another aspect, a voltage generator circuit providing voltages suitable for programming, reading, and erasing a flash EEPROM chip, comprises a first means connected to a low voltage source for generating, in response to a first state of a mode select signal, a high voltage and a high current suitable for programming selected flash EEPROM cells of the flash EEPROM chip, and a second means connected to the low voltage source for generating, in response to a second state of the mode select signal, a high voltage and a low current suitable for generating voltages useful for reading and erasing selected flash EEPROM cells of the flash EEPROM chip.

Additional objects, features and advantages of the various aspects of the present invention will become apparent from the following description of its preferred embodiment, which description should be taken in conjunction with the accompanying drawings.

DESCRIPTION OF THE PREFERRED EMBODIMENT

Figure 1A:
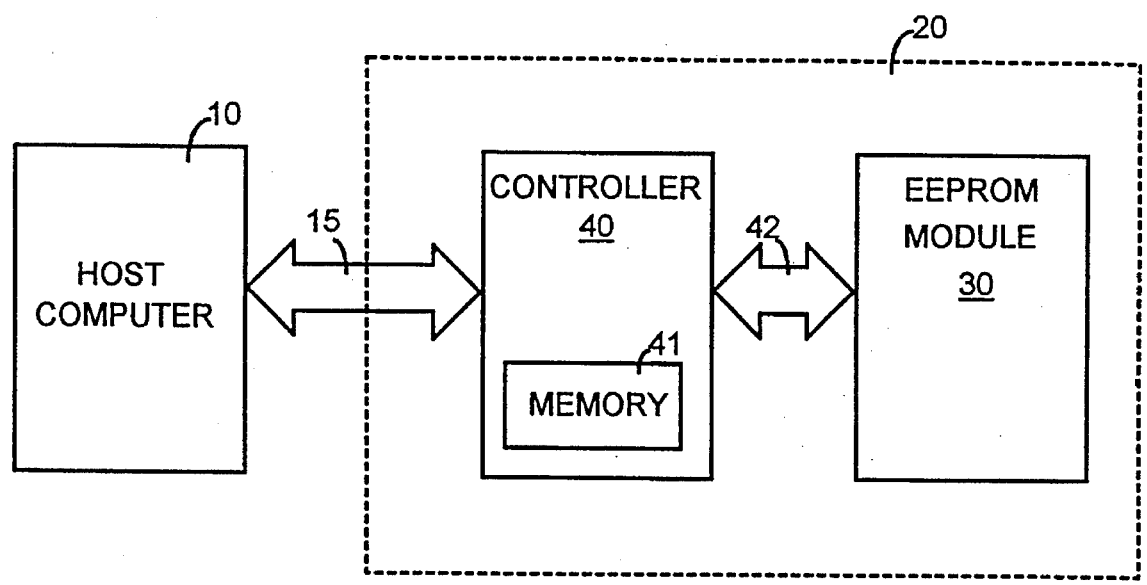
FIGS. 1A and 1B respectively illustrate, as examples, a block diagram of a flash EEPROM system connected to a host computer, and additional detail on a flash EEPROM module of the flash EEPROM system.
Figure 1B:
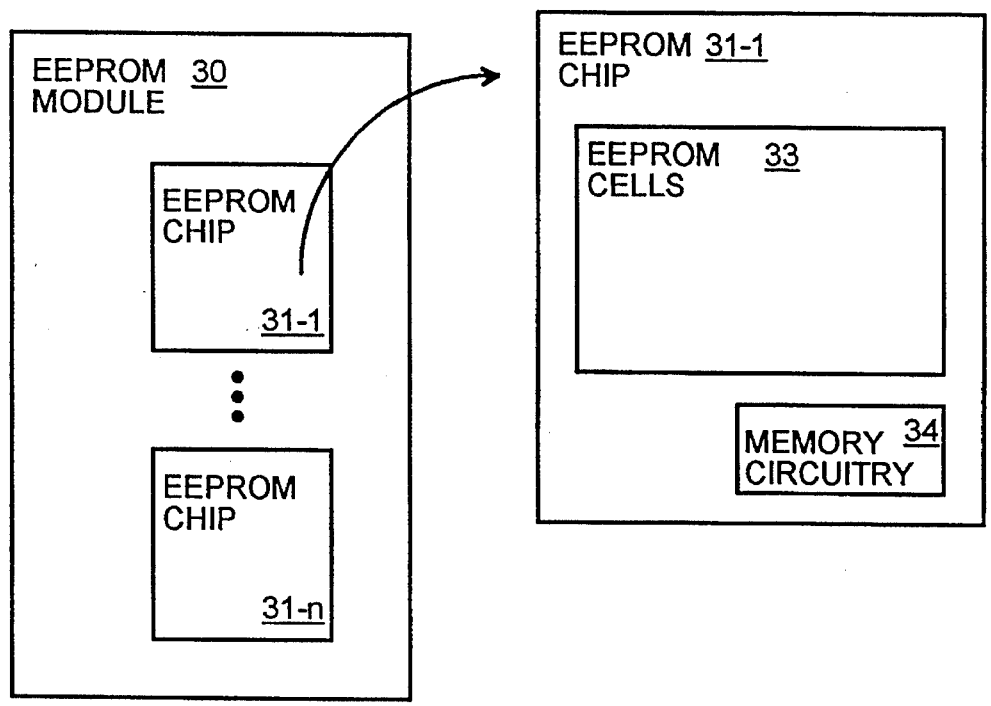
Figure 4:
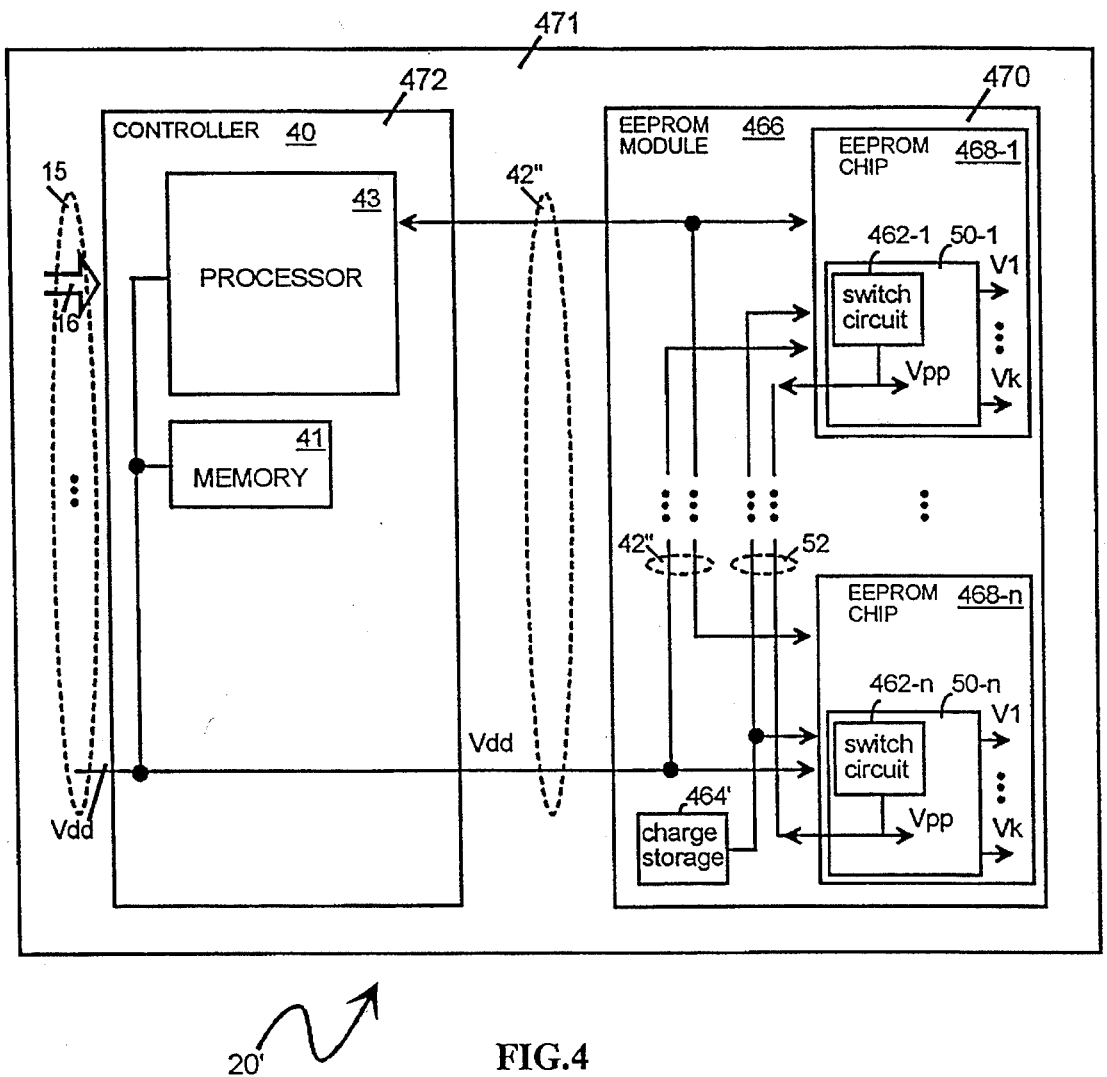
FIG. 4 illustrates, as an example, a block diagram of a flash EEPROM system utilizing aspects of the present invention.

FIG. 4 illustrates a flash EEPROM system 20' utilizing aspects of the present invention. The flash EEPROM system 20' functions as a mass storage medium for a host computer in a similar fashion as the flash EEPROM system 20 described in reference to FIG. 1A. Included within the flash EEPROM system 20' are a controller 40' and an flash EEPROM module 466, wherein devices having the same reference numbers in FIG. 4 and FIGS. 2A–2C are to be understood as having identical functions and constructions. In particular, the same reference number is used for the controller in FIG. 4 as the controllers in FIGS. 2B and 2C, because it is similarly constructed and operated. On the other hand, a different reference number is used for the flash EEPROM module in FIG. 4 from the flash EEPROM modules in FIGS. 2A–2C, because it is different in construction and operation.

Figure 2A:
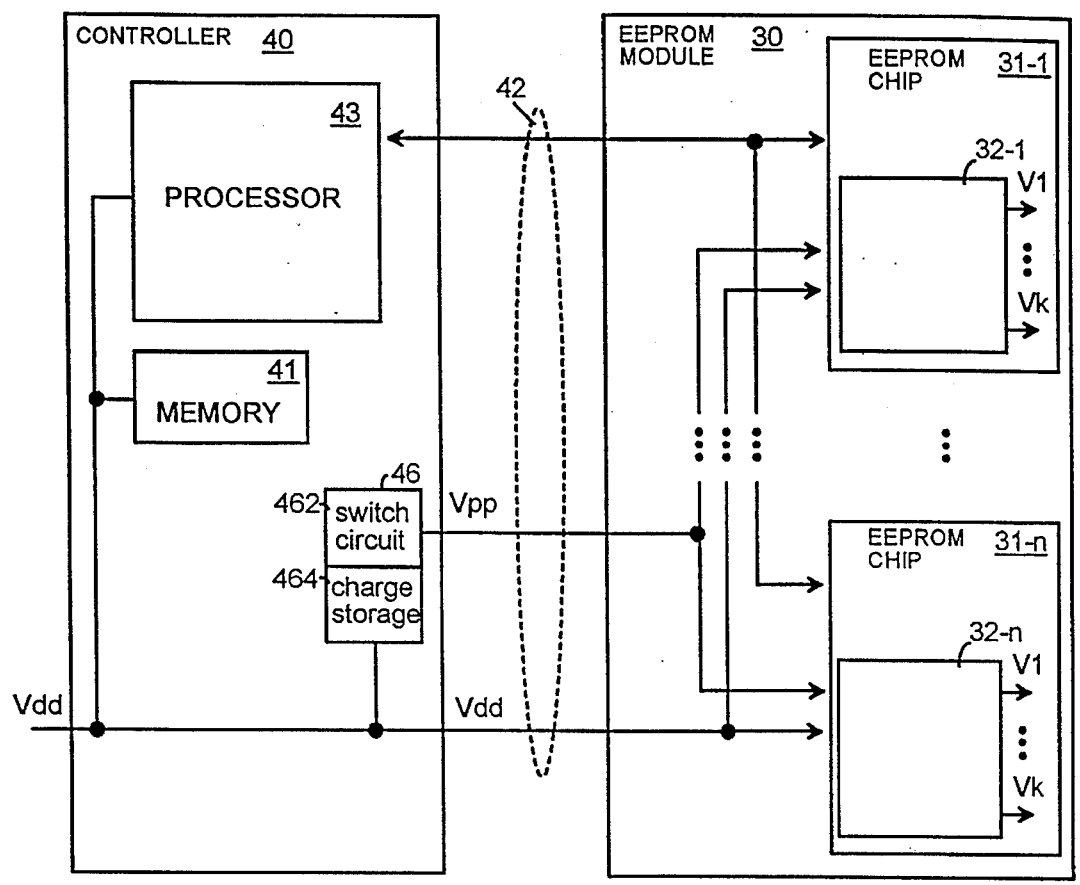
FIGS. 2A–2C illustrate, as examples, block diagrams for three different flash EEPROM systems.
Figure 2B:
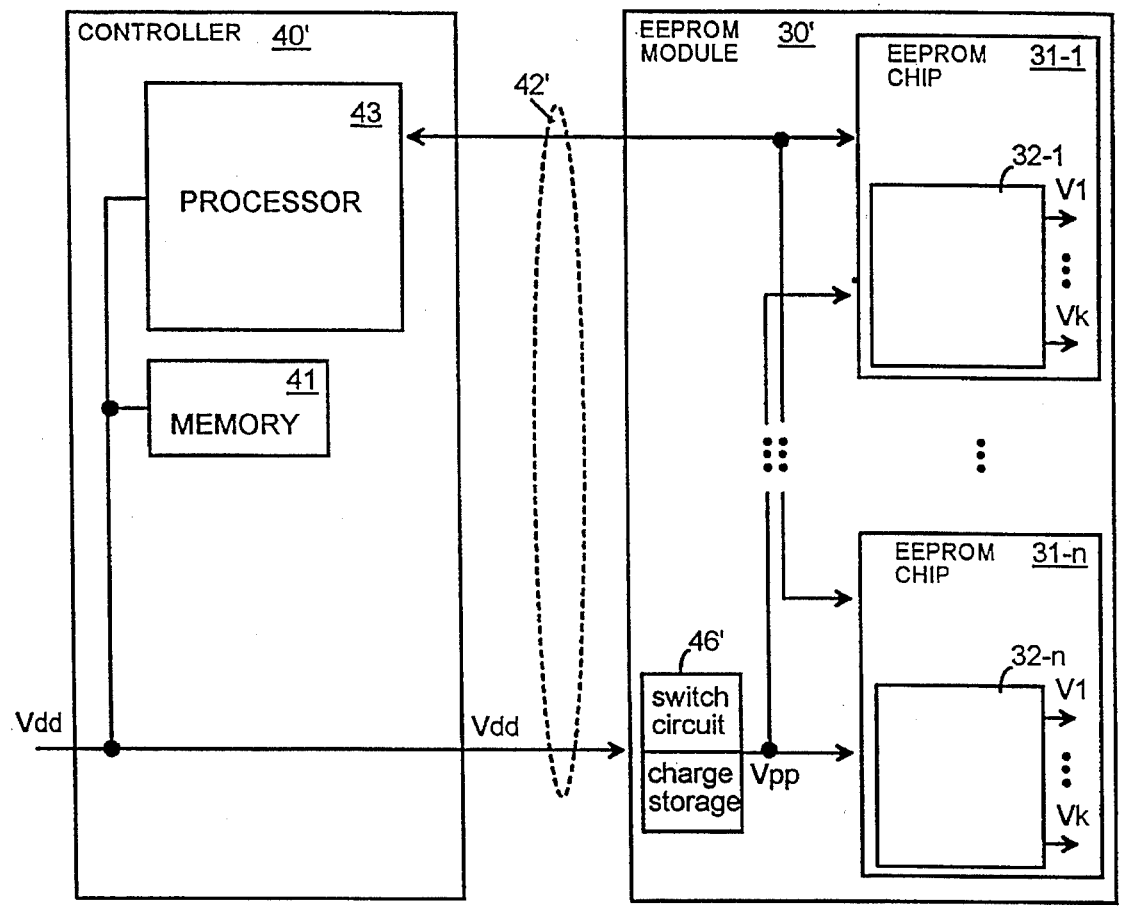
Figure 2C:
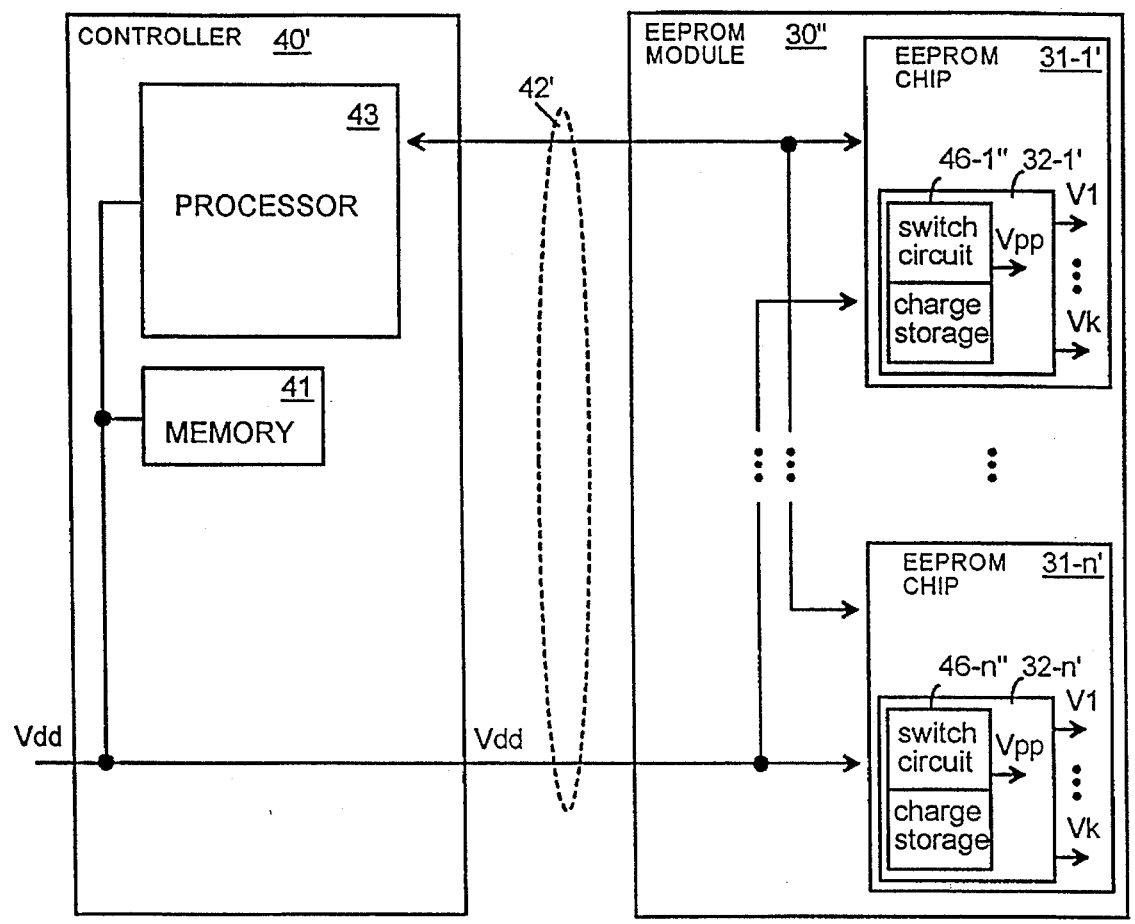

The controller 40' includes a processor 43 and a memory 41 mounted on a printed circuit board 472, wherein the functions of the processor 43 and the memory 41 are substantially the same as their identically referenced counterparts in FIGS. 2A–2C. The flash EEPROM module 466 includes a plurality of flash EEPROM chips 468-1 to 468-n and a charge storage unit 464' mounted on a printed circuit board 470. The controller printed circuit board 472 and the flash EEPROM module printed circuit board 470 are mounted on a third printed circuit board 471 which provides structural support and electrical connectivity functions. Each of the flash EEPROM chips 468-1 to 468-n includes an on-chip programmable power generation circuit, e.g., 50-1 to 50-n, which generates the programming, reading, and erasing voltages V1 to Vk required for the operation of flash EEPROM cells on the flash EEPROM chip, e.g., 468-1 to 468-n. Each of the on-chip programmable power generation circuits 50-1 to 50-n include a switching circuit, e.g., 462-1 to 462-n, which in conjunction with the charge storage unit 464' generate a high voltage Vpp from a logic level voltage Vdd and supply that high voltage Vpp to other circuitry in its respective programmable power generation circuit, e.g., 50-1 to 50-n, so that the other circuitry can generate the programming, reading, and erasing voltages V1 to Vk. Although the controller 40' and flash EEPROM module 466 are shown to be on different printed circuit boards, 472 and 470, respectively, it is to be appreciated that the various aspects of the present invention are equally applicable to embodiments wherein the controller 40' is included on the same printed circuit board as the flash EEPROM module 466.

Figure 8A:
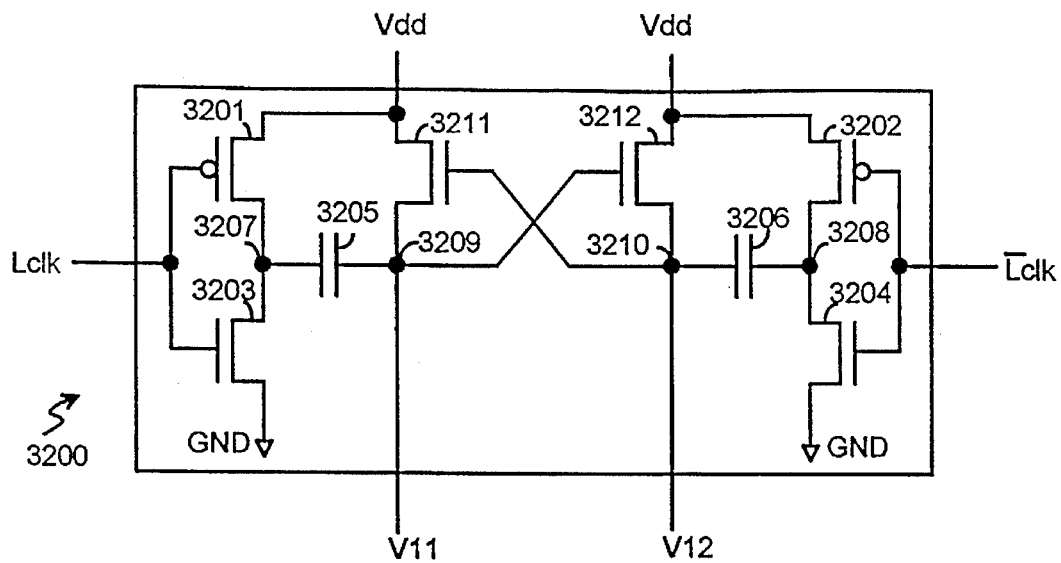
FIGS. 8A–8C illustrate, as an example, a high current charge pump circuit suitable for use in the high voltage generator circuits of FIGS. 5 and 6.
Figure 8B:
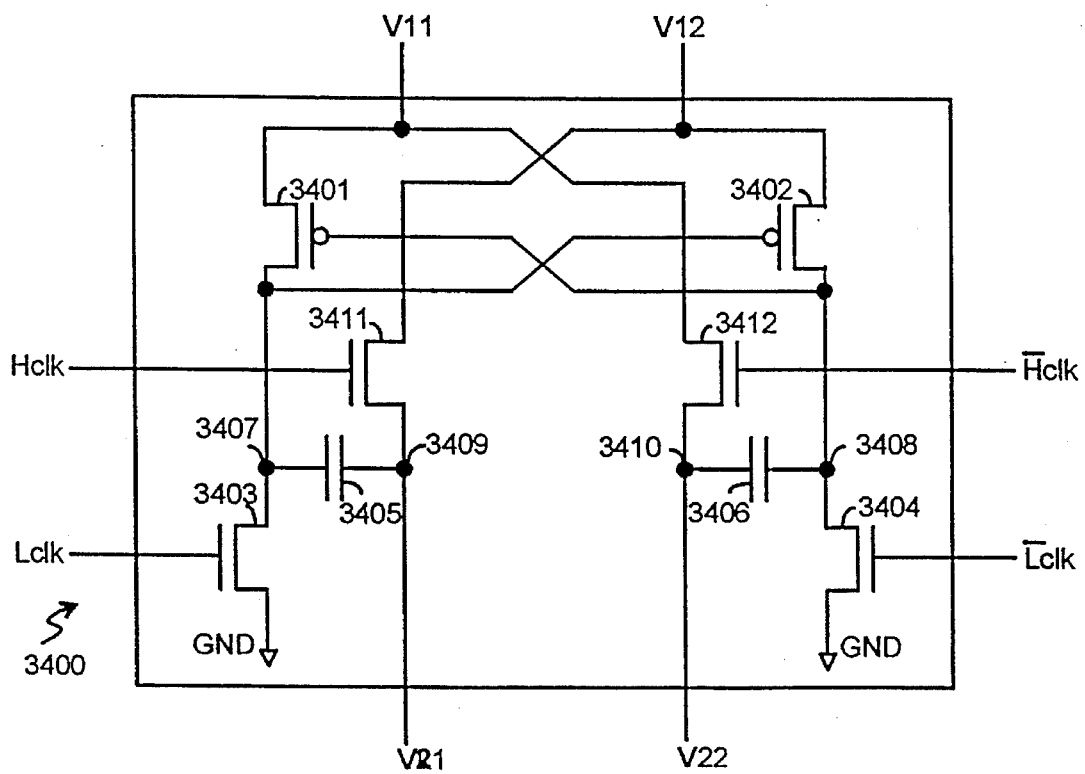
Figure 8C:
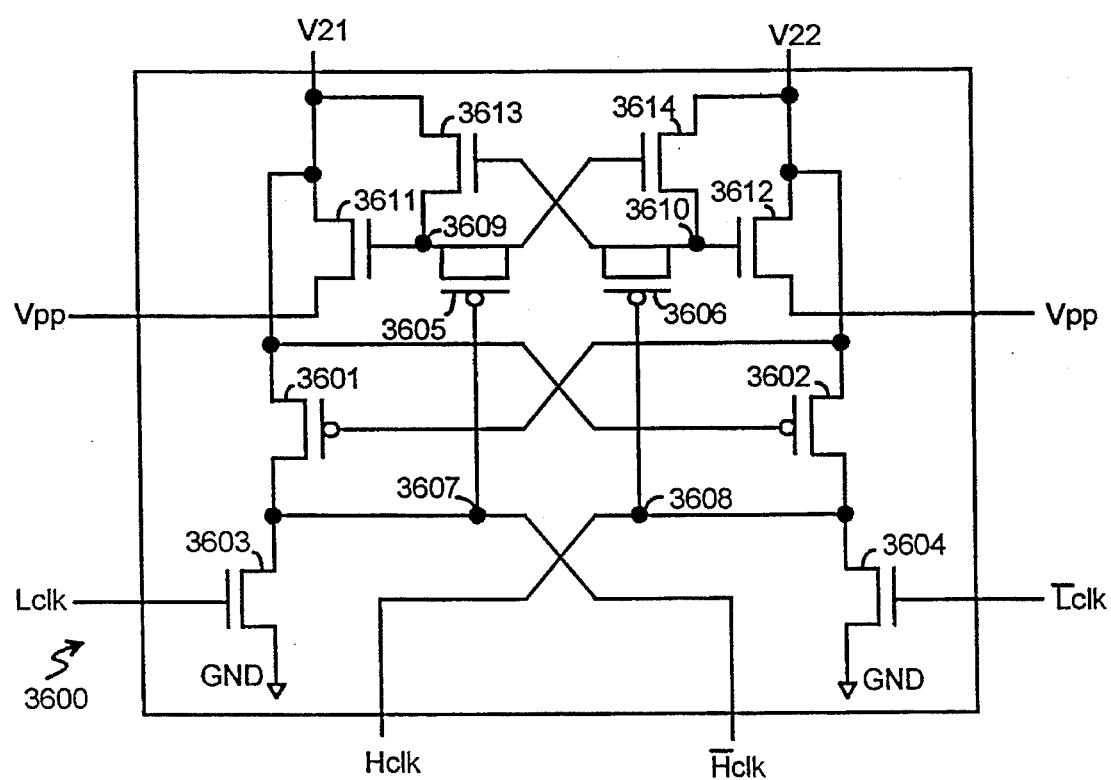

To generate the high voltage Vpp (e.g., 12 volts) from the lower logic level voltage Vdd (e.g., 5 volts or 3 volts), each of the switching circuits, e.g., 462-1 to 462-n, combine with the charge storage unit 464' to form a charge pump circuit, such as, for example, the charge pump circuit depicted in FIGS. 8A–8C. In particular, discrete capacitors 3205, 3206, 3405, and 3406 of FIGS. 8A–8C are preferably mounted on the printed circuit board 470 (or alternatively, on the printed circuit board 471) to form the charge storage unit 464', and the remaining FET circuitry of FIGS. 8A–8C are preferably included on each of the flash EEPROM chips 468-1 to 468-n to form the switching circuitry 462-1 to 462-n. As shown in FIG. 4, each of the switching circuits, e.g., 462-1 to 462-n, not only provides the high voltage Vpp to other circuitry in its respective programmable power generation circuit, e.g., 50-1 to 50-n, but also through a bus 52 formed on flash EEPROM module 466 to other programmable power generation circuits, e.g., 50-1 to 50-n, formed on other flash EEPROM chips 468-1 to 468-n within the flash EEPROM module 466.

The structure of flash EEPROM module 466 as illustrated in FIG. 4, has numerous advantages over each of the flash EEPROM modules 30, 30', and 30" as respectively in FIGS. 2A–2C. For example, with respect to flash EEPROM modules 30 and 30', the separate DC—DC converters, 46 and 46', respectively depicted in FIGS. 2A and 2B, have been eliminated, and functioning in their place in flash EEPROM module 466 are switching circuitry 462-1 to 462-n respectively formed on flash EEPROM chips 468-1 to 468-n which selectably act in conjunction with common charge storage unit 464' formed, for example, on the printed circuit board 470 of the flash EEPROM module 466. Since the charge storage unit 464' is preferably formed of discrete capacitors (e.g., 3205, 3206, 3405, and 3406 of FIGS. 8A–8C), the component costs of such a charge storage unit 464' is considerably less than that of a typical DC—DC converter. Further, the board space occupied by such a charge storage unit 464' is considerably less than the board space occupied by a typical DC—DC converter. Although switching circuitry 462-1 to 462-n are respectively added to flash EEPROM chips 468-1 to 468-n, the die size of the flash EEPROM chips 468-1 to 468-n are negligibly increased by such addition. Further, redundancy of such switching circuitry 462-1 to 462-n adds to the reliability of the flash EEPROM module 466, as will be elaborated upon below.

Further, with respect to flash EEPROM module 30", the charge storage portions of charge pumps 46-1" to 46-n" depicted in FIG. 2C have been eliminated, and functioning in their place in flash EEPROM module 466 is a common charge storage unit 464' mounted, for example, on the printed circuit board 470 of flash EEPROM module 466 and shared by each of the flash EEPROM chips 468-1 to 468-n through bus 52 of the flash EEPROM module 466. The elimination of the charge storage portions from each of the flash EEPROM chips significantly reduces the die size of these chips since the charge storage portions are conventionally formed of a plurality of capacitors or inductors which tend to require a relatively large portion of the die area for their formation. On the other hand, by forming the switching circuitry of the charge pumps on each of the flash EEPROM chips, the advantages obtained by such redundancy are available at minimal cost in terms of increased die size. Operational costs and reliability of the flash EEPROM module 466 are also enhanced relative to the flash EEPROM module 30", because the charge storage devices in the charge storage unit 464' are relatively inexpensive and can be easily replaced without discarding any of the relatively expensive flash EEPROM chips 468-1 to 468-n in flash EEPROM module 466, which would be the case in the event that one of the charge storage units became dysfunctional in charge pumps 46-1" to 46-n" of flash EEPROM chips 31-1' to 31-n' in flash EEPROM module 30". Further, an additional feature of the flash EEPROM module 466 is that the high voltage Vpp can be not only generated in any selected one of the flash EEPROM chips 468-1 to 468-n, but also, that the high voltage Vpp generated by one of the flash EEPROM chips 468-1 to 468-n can be selectively provided to any one of the other flash EEPROM chips 468-1 to 468-n via bus 52 of the flash EEPROM module 466.

Figure 5:
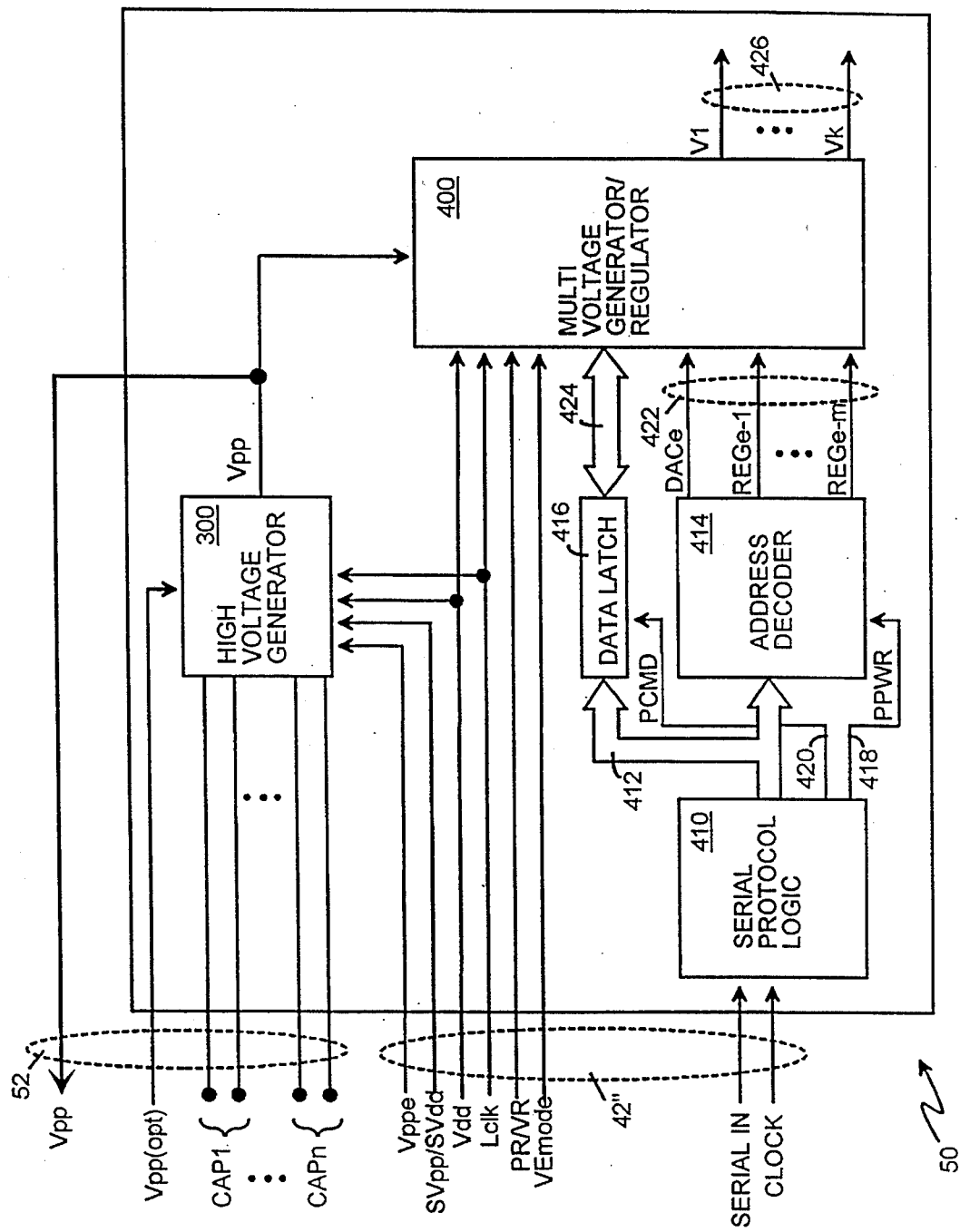
FIG. 5 illustrates, as an example, an on-chip programmable power generation circuit utilizing aspects of the present invention.

FIG. 5 illustrates a block diagram including major components of the programmable voltage generators 50-1 to 50-n (referred to hereinafter as simply programmable voltage generator 50 since each of the programmable voltage generators 50-1 to 50-n are identically constructed). The heart of the programmable voltage generator 50 is a multi-voltage generator 400 which generates and regulates the voltages V1 to Vk for programming, reading, and erasing selected ones of the flash EEPROM cells from information stored in the multi-voltage generator 400 by the controller 40. Other major components include a high voltage generator 300 which generates a high voltage Vpp for the multi-voltage generator 400, and various logic 410–424 for storing the information indicative of the voltages V1 to Vk into the multi-voltage generator 400 by the controller 40'.

In a preferred embodiment, the controller 40' serially provides voltage information indicative of one of the voltages V1 to Vk followed by information indicative of where such voltage information is to be stored in the multi-voltage generator 400 to serial protocol logic 410, via serial input SERIAL IN and clock signal CLOCK of bus 42". In response, the serial protocol logic 410 latches the voltage information into data latch 416, via bus 412 and control signal PCMD, and provides the information indicative of where the latched voltage information is to be stored in the multi-voltage generator 400 to address decoder 414, via bus 420 and control signal PPWR. The address decoder 414 in turn, decodes the information indicative of where the latched voltage information is to be stored in the multi-voltage generator 400, and enables an appropriate register in the multi-voltage generator 400 by activating a corresponding one of the enabling connections REGe-1 to REGe-n.

Figure 6:
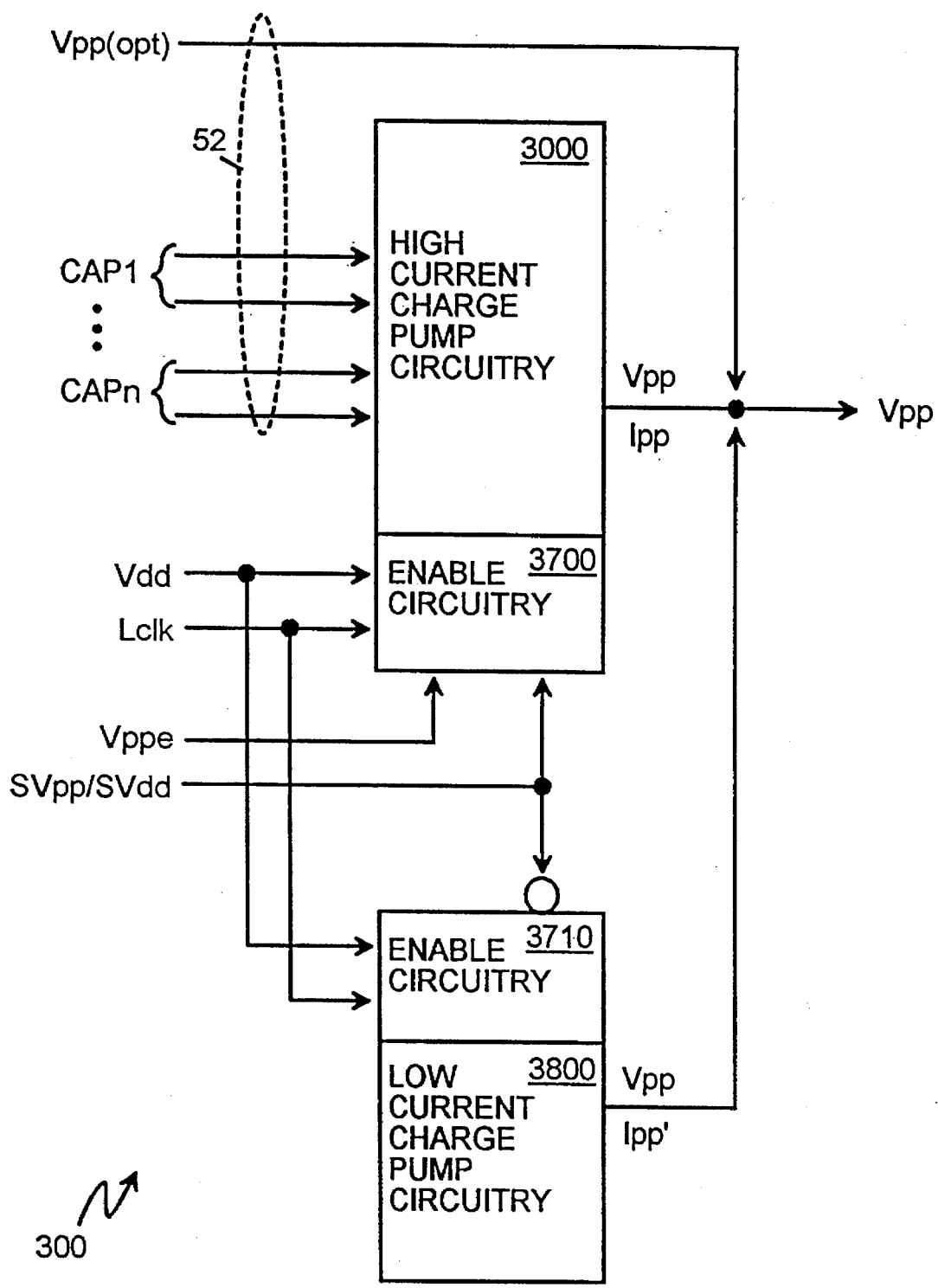
FIG. 6 illustrates, as an example, a high voltage generator circuit utilizing aspects of the present invention, which can be employed in the on-chip programmable power generation circuit of FIG. 5.

FIG. 6 illustrates a block diagram further detailing the high voltage generator circuit 300. The high voltage generator circuit 300 generates the high voltage Vpp from one of three sources, as selected by the controller 40'. The first source Vpp(opt) is an off-chip source preferably provided from another flash EEPROM chip in the same flash EEPROM module. For example, as shown in FIG. 4, each of the flash EEPROM chips 468-1 to 468-n on flash EEPROM module 466 has a programmable voltage generator 50-1 to 50-n respectively residing on it which can generate the high voltage Vpp and make the generated high voltage Vpp available to any one of the other flash EEPROM chips 468-1 to 468-n via common bus 52. One advantage of such an arrangement is that if for some reason the other two sources for generating the high voltage Vpp in a high voltage generator circuit 300 are not functioning, then the high voltage generator 300 can still provide the high voltage Vpp to other circuitry on its chip from the external source.

The second of the three sources for generating the high voltage Vpp is a high current charge pump circuit 3000 which is connected to external capacitors CAP1 to CAPn. An example of such a high current charge pump circuit 3000 is depicted in FIGS. 8A–8C, wherein the external capacitors CAP1 to CAPn are shown as capacitors 3205, 3206, 3405, and 3406 and the high current charge pump circuit 3000 comprises the remainder of the FET circuitry depicted in FIGS. 8A–8C which are connected to the external capacitors 3205, 3206, 3405, and 3406 at nodes 3207 and 3209, 3208 and 3210, 3407 and 3409, and 3408 and 3410, respectively. By placing the capacitors 3205, 3206, 3405, and 3406 off-chip (i.e., not including them on the flash EEPROM chips 468-1 to 468-n), the physical size of these capacitors can be relatively large without impacting the die size of the flash EEPROM chips 468-1 to 468-n and as a consequence, their current providing capacity which is proportional to their physical size, can be relatively large without impacting the die size of the flash EEPROM chips 468-1 to 468-n.

The third of the three sources for generating the high voltage Vpp is a low current charge pump circuit 3800 which, unlike the high current charge pump circuit 3000, includes internal capacitors (not shown). The low current charge pump circuit 3800 can be formed of any one of numerous conventional charge pump types. Because the capacitors of the low current charge pump circuit 3800 are formed on-chip (i.e., including them on each of the flash EEPROM chips 468-1 to 468-n), in order to maintain reasonable die sizes for the flash EEPROM chips 468-1 to 468-n, they are relatively smaller than their external capacitor counterparts CAP1 to CAPn of the high current charge pump circuitry 3000 and as a consequence, they provide correspondingly less current. Although generally inadequate for flash EEPROM cell programming purposes, the current provided by the low current charge pump circuit 3800 is adequate, however, for flash EEPROM cell reading and erasing purposes. For flash EEPROM cell programming purposes, the higher current provided by the high current charge pump circuit 3000 is required.

The controller 40' activates one of the three sources for generating the high voltage Vpp through control signals Vpp, and SVpp/SVdd. When low current capability is required, for example, when reading or erasing the flash EEPROM cells, the controller 40' may activate any one of the three sources for generating the high voltage Vpp, although preferably the low current charge pump circuit 3800 would be activated to reduce power consumption. On the other hand, when high current capability is required, for example, when programming the flash EEPROM cells, the controller 40' deactivates the low current charge pump circuit 3800 by making control signal Svpp/SVdd HIGH which causes an enabling circuit 3710 of conventional construction to disable the low current charge pump circuit 3800. The high current Vpp is then selectably provided from either the external source Vpp(opt) or the high current charge pump circuit 3000 by the controller 40' making control signal Vppe either LOW or HIGH, respectively, which causes an enabling circuit 3700 of conventional construction to disable or enable, respectively, the high current charge pump circuit 3000. Preferably, the enabling circuit 3700 is so constructed that when the high current charge pump circuit 3000 is disabled, the enabling circuit 3700 disconnects at least the logic supply voltage Vdd from the high current charge pump circuit 3000 so that no current will flow through the circuit while it is inactive. Likewise, the enabling circuit 3710 is similarly constructed so that when the low current charge pump circuit 3800 is disabled, the enabling circuit 3710 disconnects at least the logic supply voltage Vdd from the low current charge pump circuit 3800 so that no current will flow through the circuit while it is inactive. Both enabling circuits 3700 and 3710 may also disconnect the clock signal Lclk from the high and low current charge pump circuits 3000 and 3800, respectively, when the high and low current charge pump circuits 3000 and 3800, respectively, are disabled.

Figure 7:
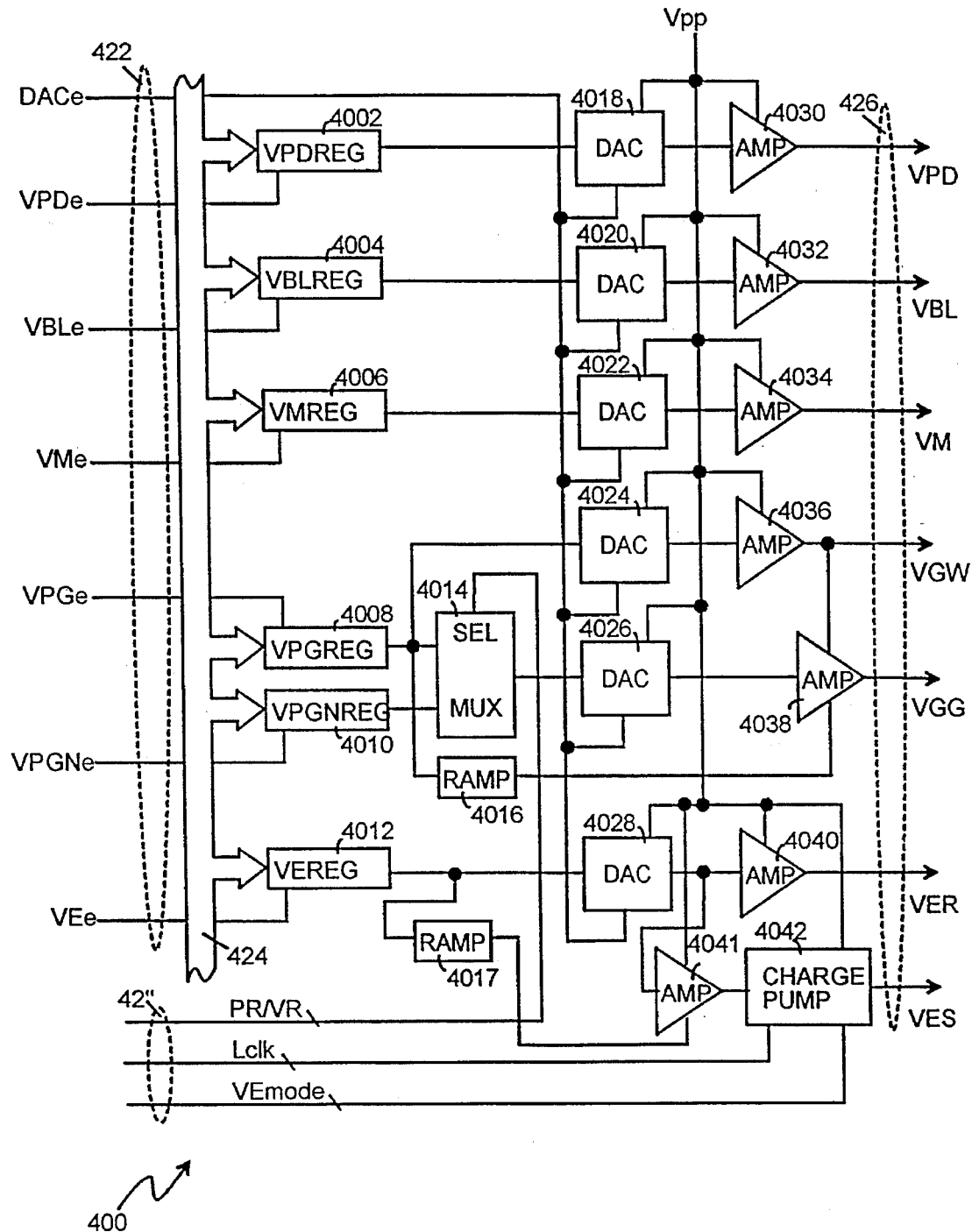
FIG. 7 illustrates, as an example, a multi-voltage generator/regulator circuit utilizing aspects of the present invention, which can be employed in the on-chip programmable power generation circuit of FIG. 5.

FIG. 7 illustrates a multi-voltage generator/regulator circuit 400 utilizing aspects of the present invention, which can be employed in the on-chip programmable power generation circuit 50. The multi-voltage generator/regulator circuit 400 includes a plurality of registers 4002–4012 for storing digital values indicative of various voltages for programming, reading, and erasing one or more selected flash EEPROM cells. For example, a VPDREG register 4002 stores a digital value indicative of a general logic voltage VPD, a VBLREG register 4004 stores a digital value indicative of a bit line voltage VBL during programming mode, a VMREG register 4006 stores a digital value indicative of a voltage provided to the gate of a reference flash EEPROM cell, a VPGREG register 4008 stores a digital value indicative of a word line voltage during programming mode, a VPGNREG register 4010 stores a digital value indicative of a word line voltage during reading or verifying modes, and a VEREG register 4012 stores a digital value indicative of an erase gate voltage. Other or alternative registers may be provided depending upon the programming, reading, and erasing voltage scheme employed in a particular flash EEPROM system without detracting from the inventive aspects of the present invention, and are fully contemplated within the full scope of the present invention.

In a preferred embodiment, each of the plurality of registers 4002–4012 is loaded with its stored value (i.e., programmed) by the controller 40' as described in reference to FIG. 5. In particular, the controller 40' programs a selected one of the plurality of registers 4002–4012 by providing its digital value to the selected register via data latch 416 and data bus 424, and providing its register address to address decoder 414 which in turn, decodes the provided address to enable a register enable line connected to the selected register, wherein each of the register enable lines, REGe-1 to REGe-m, in FIG. 5 corresponds to one of the register enable lines, e.g., VPDe, VBLe, Vme, etc. in FIG. 6. The controller 40' also provides certain control signals to the multi-voltage generator/regulator circuit 400 via bus 42".

Also included in the multi-voltage generator/regulator circuit 400 are a plurality of digital-to-analog converters ("DACs") 4018–4028 which convert the digital information stored in the plurality of registers 4002–4012 into corresponding analog voltages, and a plurality of feedback amplifiers ("AMPs") 4030–4041 conventionally constructed to buffer, amplify, and regulate the analog voltages provided by the plurality of DACs 4018–4028 to provide voltages useful in programming, reading, and erasing selected flash EEPROM cells. Except for AMP 4038, the high voltage Vpp is provided to each of the DACs 4018–4028 and AMPs 4030–4041 by the high voltage generator circuit 300. AMP 4038 receives its supply voltage from the output of AMP 4036 to ensure that the word line voltage applied to the control gates of the selected flash EEPROM cells is always less than or equal to a bias voltage applied to an n-well containing XDEC circuitry (not shown) generating the word line voltages.

To simplify the description, a single enable line DACe is shown connected to each of the DACs 4018–4028 to simultaneously activate the DACs 4018–4028. It is to be appreciated, however, that each of the DACs 4018–4028 may be enabled separately or by groups to conserve power when the voltages that they provide are not being used. As examples, if the controller 40 is programming selected flash EEPROM cells, then only those DACs providing programming related voltages need be activated; if the controller 40 is reading selected flash EEPROM cells, then only those DACs providing reading related voltages need be activated; and if the controller 40 is erasing selected flash EEPROM cells, then only those DACs providing erasing related voltages need be activated.

Also included in the multi-voltage generator/regulator circuit 400 are a multiplexer circuit ("MUX") 4014, which in response to a control signal PR/VR from the controller 40', passes either the digital value stored in the VPGREG register 4008 or the VPGNREG register 4010 to DAC 4026, a ramp circuit 4016 which controls the slew rate of feedback amplifier 4038 in response to two extra bits stored in the VPGREG 4008, a ramp circuit 4017 which controls the slew rate of feedback amplifier 4041 in response to two extra bits stored in the VEREG 4012, and a low current charge pump circuit 4042 including enabling circuitry responsive to a control signal Vemode from the controller 40'. The MUX 4014 saves one DAC/AMP pair by selectively providing to the word line connected to one or more selected flash EEPROM cells either a programming voltage (e.g., 11 volts) corresponding to the digital value stored in the VPGREG register 4008 or a reading voltage (e.g., 5 volts) corresponding to the digital value stored in the VPGNREG 4010. A significant advantage of storing the programming and reading voltages for the word line in separate registers rather then having them share one register, is that this arrangement significantly speeds up the programming process by eliminating the loading and reloading delays caused by swapping them in and out of the single register when programming the selected EEPROM cells by a series of program/verify pulses. The charge pump circuit 4042 generates the erase mode, erase gate voltage (e.g., 20 volts) from the read mode, erase gate voltage (e.g., 2 volts). Since the charge pump circuit 4042 does not have to provide high current, it can be constructed such as the low current charge pump circuitry 3800 of the high voltage generator circuit 300.

In practice, the multi-voltage generator/regulator circuit 400 facilitates provision of the optimal values for programming, reading, and erasing selected flash EEPROM cells throughout the operational life of an flash EEPROM chip containing such circuitry. For example, the values stored in the plurality of registers 4002–4012 may initially correspond to optimal values for programming, reading, and erasing flash EEPROM cells manufactured by a particular manufacturer, and may be continually updated by the controller 40' during the operational life of the flash EEPROM cells to reflect changes in the optimal values for programming, reading, and erasing the flash EEPROM cells. In particular, the values stored in the plurality of registers 4002–4012 may be updated for different selected flash EEPROM cells within the same flash EEPROM chip based upon information stored in headers (e.g., 3102-1 to 3102-y in FIG. 10) associated with the different selected flash EEPROM cells.

FIGS. 8A–8C illustrate, as an example, a preferred embodiment of the high current charge pump circuit 3000, a detailed description of which is provided in a copending patent application Ser. No. 08/157,573, filed Nov. 24, 1993, entitled "Charge Pump Circuit," and naming Raul-Adrian Cernea as inventor, which is incorporated herein by this reference.

In FIG. 8A, a first voltage doubler stage 3200 of the charge pump circuit 3000 is connected to first and second external capacitors, 3205 and 3206, respectively, which charge up and supply power on alternating phases of an input clock signal Lclk to a second voltage doubler stage 3400 (FIG. 8B) of the charge pump circuit 3000. In particular, on a first phase of the input clock signal Lclk the first external capacitor 3205 is providing a first output voltage V11 and first output current I11 to a first input of the second stage 3400 of the charge pump circuit 3000, while the second external capacitor 3206 is charging up, and on a second phase of the input clock signal Lclk the second external capacitor 3206 is providing a second output voltage V12 and a second output current I12 to a second input of the second stage 3400 of the charge pump circuit 3000, while the first external capacitor 3205 is charging up. The first voltage doubler stage 3200 includes p-mos FETs 3201 and 3202 and n-mos FETs 3203, 3204, 3211, and 3212, which connect to the first external capacitor 3205 at node connections 3207 and 3209, and connect to the second external capacitor 3206 at node connections 3208 and 3210.

In FIG. 8B, a second voltage doubler stage 3400 of the charge pump circuit 3000 is connected to third and fourth external capacitors, 3405 and 3406, respectively, which charge up and supply power on alternating phases of the input clock signal Lclk to an output stage 3600 (FIG. 8C) of the charge pump circuit 3000. In particular, on a first phase of the input clock signal Lclk the third external capacitor 3405 is providing a first output voltage V21 and first output current I21 to a first input of the output stage 3600 of the charge pump circuit 3000, while the fourth external capacitor 3406 is charging up, and on a second phase of the input clock signal Lclk the fourth external capacitor 3206 is providing a second output voltage V22 and a second output current I22 to a second input of the output stage 3600 of the charge pump circuit 3000, while the third external capacitor 3405 is charging up. The second voltage doubler stage 3400 includes p-mos FETs 3401 and 3402 and n-mos FETs 3403, 3404, 3411, and 3412, which connect to the third external capacitor 3405 at node connections 3407 and 3409, and connect to the fourth external capacitor 3406 at node connections 3408 and 3410.

In FIG. 8C, an output stage 3600 of the charge pump circuit 3000 receives the first and second output voltages, V21 and V22, and first and second output currents, I21 and I22, from the second voltage doubler stage 3400 and generates therefrom, the high voltage and high current, Vpp and Ipp, respectively, wherein on the first phase of the input clock signal Lclk, the high voltage and high current, Vpp and Ipp, are supplied by the first output voltage and current, V21 and I21, and on the second phase of the input clock signal Lclk, the programming voltage and current, Vpp and Ipp, are supplied by the second output voltage and current, V22 and I22. In addition to generating the high voltage and high current, Vpp and Ipp, the output stage 3600 also generates a high voltage clock signal Hclk which it feeds back to the second voltage doubler stage 3400 (FIG. 8B). The output stage 3600 includes p-mos. FETs 3601 and 3602, p-mos FET capacitors 3605 and 3606, and n-mos FETs 3603, 3604, 3611, 3612, 3613, and 3614.

Figure 9:
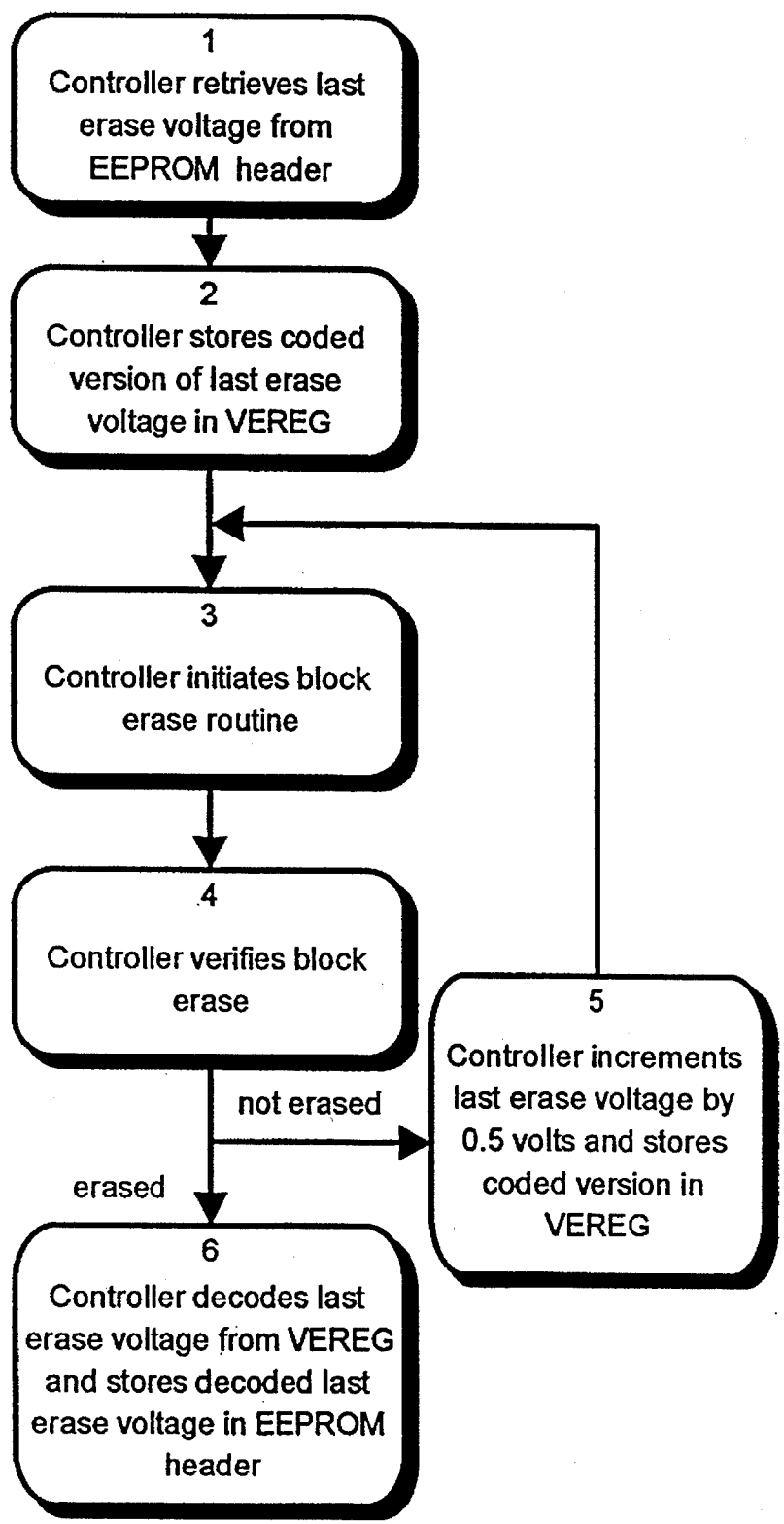
FIG. 9 illustrates, as an example, a flow diagram for automatically adjusting a voltage to be applied to an erase gate of a flash EEPROM cell each time the flash EEPROM cell is to be erased.
Figure 10:
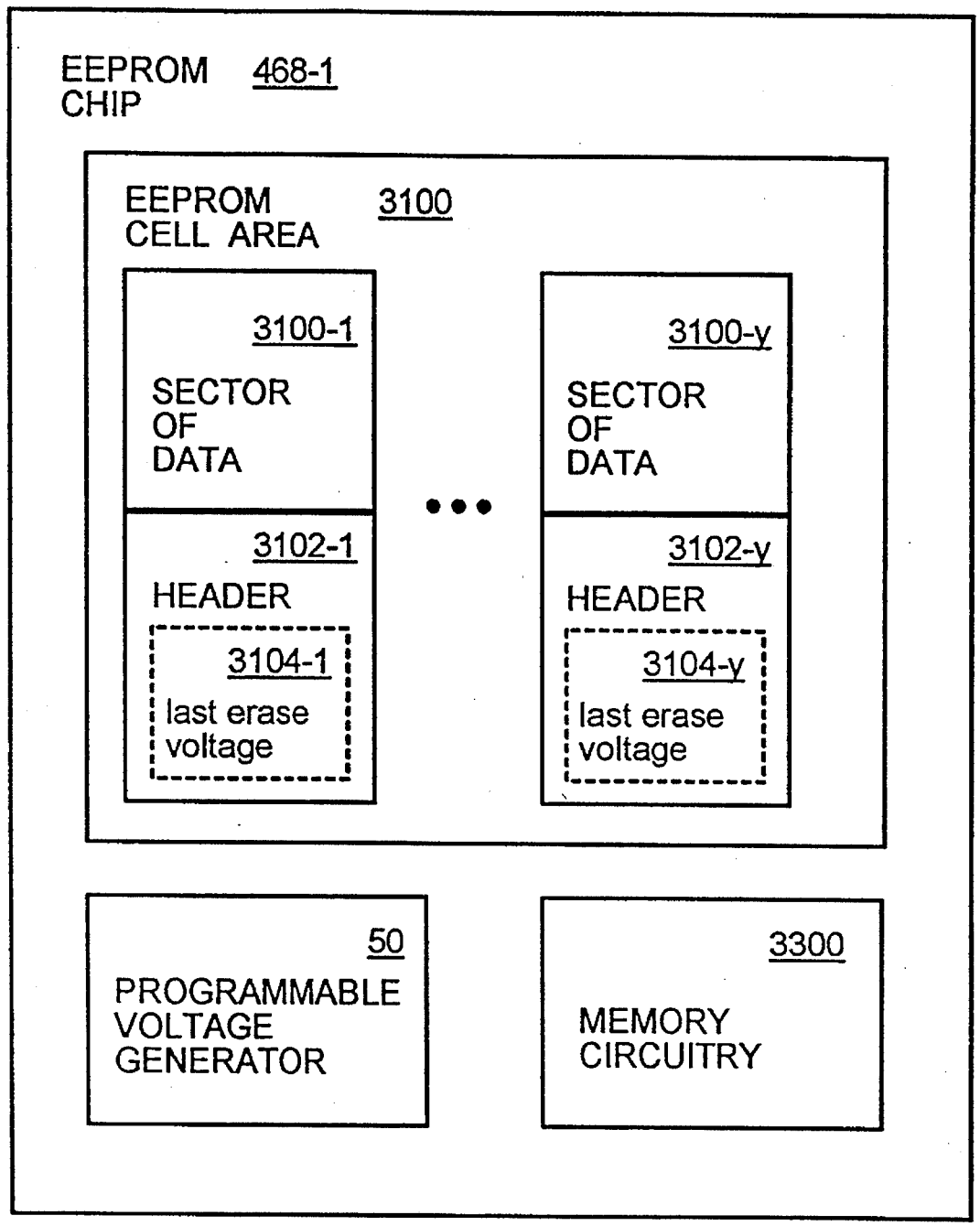
FIG. 10 illustrates, as an example, certain features of a flash EEPROM chip utilizing aspects of the present invention.

FIGS. 9 and 10 illustrate, as an example, one application of the programmable voltage generator 50 wherein an optimal erase voltage is provided to selected flash EEPROM cells throughout the operational life of the selected flash EEPROM cells. Referring first to FIG. 10, an flash EEPROM chip 468-1 is illustrated comprising an flash EEPROM cell area 3100, memory circuitry 3300 for controlling access to selected ones of flash EEPROM cells in the flash EEPROM cell area 3100, and the programmable voltage generator circuit 50. The flash EEPROM cell area 3100 is divided up into a plurality of data sectors 3100-1 to 3100-y. Associated with each of the data sectors 3100-1 to 3100-y is a corresponding header 3102-1 to 3102-y containing information about the data sector. Included among the header information is a last erase voltage 3104-1 to 3104-y which is a voltage that was last used for erasing data in the header's corresponding data sector. Additional details on such a data and header file structure is provided in a copending patent application Ser. No. 07/759,497, filed Sept. 13, 1991, entitled "Flash EEPROM Array Data and Header File Structure," and naming John S. Mangan, Robert D. Norman, Jeffrey Craig, Richard Albert, Anil Gupta, Jeffrey Donald Stai, and Karl M. J. Lofgren as inventors, which is incorporated herein by this reference.

Referring now to step 1 of FIG. 9, when an flash EEPROM cell is selected to be erased, the controller 40' first retrieves the voltage value last used to erase that flash EEPROM cell from a header associated with the data sector in which the flash EEPROM cell resides. For example, if the host computer 10 communicates to the controller 40' a write command, a disk address, and a sector of data over system bus 15, the controller 40', in response to a program stored in memory 41, for example, first translates the disk address into a corresponding data sector address, such as for example, the address of data sector 3100-1 in flash EEPROM chip 468-1, then erases the data sector 3100-1 before writing the sector of data received from the host computer 10 into that data sector. Before erasing the data sector, however, the controller 40' first retrieves a last erase voltage 3104-1 which is stored in a header 3102-1 which is associated with the data sector 3100-1.

As shown in step 2 of FIG. 9, the controller 40' then converts the last erase voltage into a digital value related to that voltage and stores the digital value into the VEREG register 4012. The digital value stored in the VEREG register 4012 is related to, among other things, the DC—DC voltage gain through the charge pump 4042. As a simplified example, if the last erase voltage is 20 volts, the VEREG register 4012 is a 6-bit register, Vpp is 16.0 volts, DAC 4028 is a 6-bit DAC (e.g., 64 counts full-scale), and the charge pump 4042 generates an output voltage VES which is 4× its input voltage (i.e., the output of DAC 4028), then a digital value of 10100 binary may be stored in the VEREG register 4012, wherein the digital value 10100 binary (e.g., 20 counts) causes the output of DAC 4028 to be 5 volts (i.e., 16 volts×20/64 of full scale). Continuing with the example, if the read mode, erase gate voltage VER is to be 5 volts, then the AMP 4040 would have a unity gain.

Figures 3A, 3B:
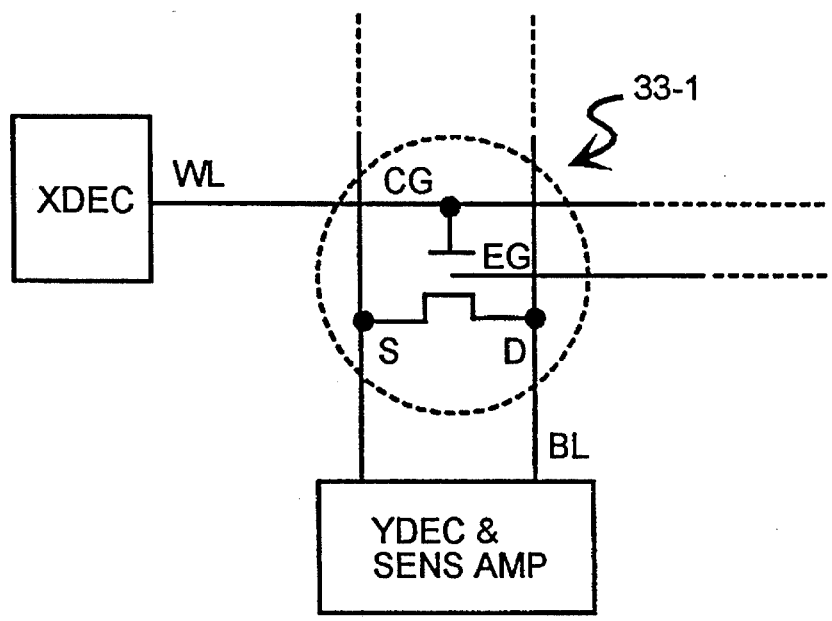
FIGS. 3A and 3B respectively illustrate, as one example, a flash EEPROM cell and various voltages for programming, reading, and erasing the flash EEPROM cell.

As shown in step 3 of FIG. 9, the controller 40' then initiates the erasing of the data sector 468-1 (wherein a block is also equivalent to a data sector for the purposes of this example). Referring back to. FIG. 3B, the controller 40' does this, for example, by causing 0 volts to be applied to the word lines and bit lines connected to the flash EEPROM cells of data sector 3100-1 while an erase gate voltage of 20 volts is applied to their erase gates.

As shown in step 4 of FIG. 9, after application of such voltages to the word lines, bit lines, and erase gates of the flash EEPROM cells in data sector 3100-1 for a predetermined period of time, for example, the controller 40' then verifies the erasure of the flash EEPROM cells in data sector 3100-1 by reading the flash EEPROM cells in data sector 3100-1. Again referring back to FIG. 3B, the controller 40' may do this, for example, by causing 5 volts to be applied to the word lines connected to the flash EEPROM cells of data sector 3100-1 while an erase gate voltage of 2 volts is applied to their erase gates and their states are being determined by sense amplifiers (not shown) connected to their bit lines.

As shown in step 5 of FIG. 9, if the data sector 3100-1 has not been completely erased, then the controller 40' increments the value of the last erase voltage by 0.5, for example, and stores a digital value corresponding to the incremented value of the last erase voltage in the VEREG register 4012 in the same manner as described in reference to step 2 of FIG. 9. Steps 3, 4 and 5 of FIG. 9 are then repeated until the controller 40' verifies that the data sector 3100-1 has been completely erased.

Finally, as shown in step 6 of FIG. 9, after the controller 40' verifies the complete erasure of data sector 3100-1, the controller 40' then stores the last erase voltage (i.e., the incremented value if the last erase voltage was incremented in step 5 or the unincremented value if the data sector 3100-1 erased on its first pass through steps 3 and 4) into the last erase voltage 3104-1 in the header 3102-1.

Additional details of the structure and operation of flash EEPROM cells, their organization into an array of flash EEPROM cells accessed through a plurality of word lines and bit lines, and the programming of those flash EEPROM cells are provided in U.S. patent application Ser. No. 08/089,175, filed Jul. 8, 1993, entitled "Method and Circuitry for Simultaneously Programming and Verifying the Programming of Selected flash EEPROM Cells," and naming Raul-Adrian Cernea, Sanjay Mehrotra and Douglas J. Lee as inventors, which is incorporated herein by this reference.

Although the various aspects of the present invention have been described with respect to a preferred embodiment, it will be understood that the invention is entitled to full protection within the full scope of the appended claims.

What is claimed is:

1. In a flash EEPROM chip having a plurality of flash EEPROM cells, a programmable voltage generator circuit comprising:

means for generating, in response to an enable signal, a high voltage and a high current from a low voltage source connected to said high voltage and high current generating means;

a plurality of registers respectively storing information indicative of a plurality of voltages suitable for programming, reading and erasing selected ones of said plurality of flash EEPROM cells; and a plurality of digital-to-analog converters connected to said high voltage and high current generating means, wherein individual ones of said plurality of digital-to-analog converters are coupled to at least one of said plurality of registers to provide an analog output voltage proportional to the information stored in said at least one register.

2. The programmable voltage generator circuit as recited in claim 1, further comprising means for storing said information in said plurality of registers.

3. The programmable voltage generator circuit as recited in claim 2, wherein said means for storing information in said plurality of registers comprises:

a data latch;

a register address decoder; and means including a controller for providing said data latch with information to be stored in a selected one of said plurality of registers, providing said register address decoder with information identifying said selected one of said plurality of registers, and causing said selected one of said plurality of registers to be enabled to receive and store said information provided to said data latch.

4. The programmable voltage generator circuit as recited in claim 1, further comprising a plurality of amplifiers, each amplifier connected to a respective one of said plurality of digital-to-analog converters and having a regulated voltage output indicative of the information stored in the at least one register connected to said respective one of said plurality of digital-to-analog converters.

5. The programmable voltage generator circuit as recited in claim 4, wherein said plurality of registers includes a bit line voltage register for storing information indicative of a bit line voltage suitable for programming selected ones of said plurality of flash EEPROM cells.

6. The programmable voltage generator circuit as recited in claim 4, wherein said plurality of registers includes a first control gate voltage register for storing information indicative of a word line voltage suitable for programming selected ones of said plurality of flash EEPROM cells, and a second control gate voltage register for storing information indicative of a word line voltage suitable for reading selected ones of said plurality of flash EEPROM cells.

7. The programmable voltage generator circuit as recited in claim 6, wherein said plurality of registers includes an erase gate voltage register for storing information indicative of a suitable erase gate voltage to be applied to the erase gates of selected ones of said plurality of flash EEPROM cells while reading said selected ones of said plurality of flash EEPROM cells.

8. In a flash EEPROM chip having a plurality of flash EEPROM cells, a programmable voltage generator circuit comprising:

means for generating, in response to an enable signal, a high voltage and a high current from a low voltage source connected to said high voltage and high current generating means;

a plurality of registers respectively storing information indicative of a plurality of voltages suitable for programming, reading and erasing selected ones of said plurality of flash EEPROM cells, wherein said plurality of registers includes a first control gate voltage register for storing information indicative of a word line voltage suitable for programming selected ones of said plurality of flash EEPROM cells, and a second control gate voltage register for storing information indicative of a word line voltage suitable for reading selected ones of said plurality of flash EEPROM cells;

a plurality of digital-to-analog converters connected to said high voltage and high current generating means, and each digital-to-analog converter respectively connected to at least one of said plurality of registers to provide an analog output voltage proportional to the information stored in said at least one register;

a plurality of amplifiers, each amplifier connected to a respective one of said plurality of digital-to-analog converters and having a regulated voltage output indicative of the information stored in the at least one register connected to said respective one of said plurality of digital-to-analog converters; and means responsive to a program/verify mode control signal for passing, when said program/verify mode control signal is in a program state, said information stored in said first control gate voltage register to a digital-to-analog converter connected to said first and second control gate voltage registers through said passing means, and for passing, when said program/verify mode control signal is in a verify state, said information stored in said second control gate voltage register to said digital-to-analog converter connected to said first and second control gate voltage registers through said passing means.

9. The programmable voltage generator circuit as recited in claim 8, wherein the regulated voltage output of the amplifier connected to the digital-to-analog converter connected to said first control gate voltage register, provides a supply voltage to the amplifier connected to the digital-to-analog converter connected to said first and second control gate voltage registers through said passing means.

10. The programmable voltage generator circuit as recited in claim 8, further comprising means responsive to said information stored in said first control gate voltage register to control a slew rate of the amplifier connected to the digital-to-analog converter connected to said first and second control gate voltage registers through said passing means.

11. In a flash EEPROM chip having a plurality of flash EEPROM cells, a programmable voltage generator circuit comprising:

means for generating, in response to an enable signal, a high voltage and a high current from a low voltage source connected to said high voltage and high current generating means;

a plurality of registers respectively storing information indicative of a plurality of voltages suitable for programming, reading and erasing selected ones of said plurality of flash EEPROM cells, wherein said plurality of registers includes an erase gate voltage register for storing information indicative of a suitable erase gate voltage to be applied to the erase gates of selected ones of said plurality of flash EEPROM cells while reading said selected ones of said plurality of flash EEPROM cells;

a plurality of digital-to-analog converters connected to said high voltage and high current generating means, and each digital-to-analog converter respectively connected to at least one of said plurality of registers to provide an analog output voltage proportional to the information stored in said at least one register;

a plurality of amplifiers, each amplifier connected to a respective one of said plurality of digital-to-analog converters and having a regulated voltage output indicative of the information stored in the at least one register connected to said respective one of said plurality of digital-to-analog converters; and a charge pump circuit responsive to an erase mode signal and an output of the digital-to-analog converter connected to said erase gate voltage register, for generating a suitable erase gate voltage to be applied to the erase gates of selected ones of said plurality of flash EEPROM cells while concurrently erasing said selected ones of said plurality of flash EEPROM cells.

12. The programmable voltage generator circuit as recited in claim 11, further comprising:

an amplifier connected between said charge pump circuit and said digital-to-analog converter connected to said erase gate voltage register; and means responsive to information stored in said erase gate voltage register to control a slew rate of said amplifier connected between said charge pump circuit and said digital-to-analog converter connected to said erase gate voltage register.

13. An on-chip method of generating a plurality of voltages suitable for programming, reading or erasing a plurality of flash EEPROM cells, comprising the steps of:

respectively storing information indicative of said plurality of voltages in a plurality of registers;

respectively converting the information stored in said plurality of registers into a plurality of analog signals respectively proportional to the information stored in said plurality of registers; and respectively generating said plurality of voltages by amplifying and regulating said plurality of analog signals.

* * * * *